United States Patent [19]

Ruth, Jr.

[11] Patent Number: 4,970,414

[45] Date of Patent: Nov. 13, 1990

[54] TTL-LEVEL-OUTPUT INTERFACE CIRCUIT

[75] Inventor: Robert N. Ruth, Jr., San Diego, Calif.

[73] Assignee: Silicon Connections Corporation, San Diego, Calif.

[21] Appl. No.: 376,608

[22] Filed: Jul. 7, 1989

[51] Int. Cl.$^5$ ............... H03K 19/013; H03K 17/04; H03K 19/092; H03K 17/16

[52] U.S. Cl. ................... 307/446; 307/570; 307/542

[58] Field of Search ............ 307/446, 570, 465, 454, 307/564, 565, 567, 475, 264, 450, 451–453

[56] References Cited

U.S. PATENT DOCUMENTS

| | | | |
|---|---|---|---|
| 4,713,561 | 12/1987 | Yamada | 307/456 |
| 4,779,014 | 10/1988 | Masuoka et al. | 307/446 |
| 4,794,280 | 12/1988 | Van Tran | 307/446 |
| 4,883,979 | 11/1989 | Tran | 307/446 |
| 4,883,988 | 11/1989 | Ide et al. | 307/446 X |
| 4,890,018 | 12/1989 | Fukushi et al. | 307/446 |
| 4,902,914 | 2/1990 | Masuoka | 307/446 |
| 4,906,866 | 3/1990 | Alexander et al. | 307/446 X |
| 4,906,868 | 3/1990 | Maki et al. | 307/446 |

OTHER PUBLICATIONS

Nakashiba et al., "A Subnanosecond Bi—CMOS GateArray Family", IEEE 1986 Custom Integrated Circuits Conference, pp. 63–66.

Nishio, Ogiye and Kadone, "Applications of Hi—BiCMOS Technology", Hitachi Review, vol. 35 (1986), No. 5, pp. 225–230.

"How Motorola Moved BiMOS up to VLSI Levels", Electronics, Jul. 10, 1986, 67–70.

Lin and Spehn, "Fast, Low—Power Logic Array Unites CMOS and Bipolar", Electronic Design, Apr. 16, 1987.

Abramowitz, Kinzer and Tam, "Power—Cell Library Brings High Voltage to Semicustom ICs", Electronic Design, Jun. 11, 1987, pp. 93–100.

"TI's BiCMOS Bus Interface ICs Slash Standby Current", Electronic Products, Jun. 15, 1987, pp. 17 and 19.

Cohen, "NEC's BiCMOS Arrays Shatter Record", Electronics, Aug. 6, 1987, pp. 82–83.

Primary Examiner—Stanley D. Miller
Assistant Examiner—David R. Bertelson
Attorney, Agent, or Firm—Edward W. Callan

[57] ABSTRACT

A TTL-level-output interface circuit includes a biCMOS inverter coupled between a voltage supply terminal and a ground terminal; a first npn transistor coupled between the voltage supply terminal and a TTL interface terminal and a second npn transistor connected in series with the first npn transistor between the TTL interface terminal and the ground terminal; an n$\phi$ network coupled between the TTL output terminal and the base of the second npn transistor by an n-channel MOSFET, which has its gate connected to the inverter input terminal. When a high input signal is applied to the inverter input terminal, the n-channel MOSFET couples the n$\phi$ network to the base of the second npn transistor, in order both to limit the base current of the second npn transistor in order to prevent saturation of the second npn transistor, and to enable current to be conducted to the base of the second npn transistor 56 through the n$\phi$ network from a load connected to the TTL output terminal, for enabling the second npn transistor to conduct current from the TTL interface terminal to the ground terminal. A p-channel MOSFET is coupled between the voltage supply terminal and the junction of the n$\phi$ network with the n-channel MOSFET. The p-channel MOSFET has its gate connected to the inverter output terminal and functions as a switchable current source for providing a minimum base current to the second npn transistor if there is no load connected to the TTL output terminal when a high -input signal is applied at the inverter input terminal.

13 Claims, 3 Drawing Sheets

TTL-LEVEL-OUTPUT INTERFACE CIRCUIT

BACKGROUND OF THE INVENTION

The present invention generally pertains to electronic circuits that combine MOS and bipolar transistors and is particularly directed to an improvement in a TTL-level-output interface circuit.

For some electronic circuit, high-density MOS transistors for performing multiple logic functions are combined with low-density bipolar transistors for providing output signals at a TTL level in order to provide adequate power for an interfaced circuit load to which power is provided in accordance with said logic functions. TTL-output-level interface circuits that combine MOS and bipolar transistors are described by Nakashiba et al., "A Subnanosecond Bi-CMOS Gate-Array Family", IEEE 1986 Custom Integrated Circuits Conference, pp. 63–66; Nishio, Ogiye and Kadono, "Applications of Hi-BiCMOS Technology", Hitachi Review, Vol 35 (1986), No. 5, pp. 225–230; "How Motorola Moved BiMOS up to VLSI Levels", Electronics, July 10, 1986, pp. 67–70; Lin and Spehn, "Fast, low-power logic array unites CMOS and bipolar", Electronic Design, Apr. 16, 1987; Abramowitz, Kinzer and Tam, "Power-cell library brings high voltage to semicustom ICs", Electronic Design, June 11, 1987, pp. 93–100; "TI's BiCMOS bus interface ICs slash standby current", Electronic Products, June 15, 1987, pp. 17 and 19; and Cohen "NEC's BiCMOS Arrays Shatter Record", Electronics, Aug. 6, 1987, pp. 82–83.

The Nakashiba et al. TTL-level-output interface circuit is described with reference to FIG. 1. This circuit includes a first CMOS inverter 10, a second CMOS inverter, 12, a first npn transistor 14, a second npn transistor 16, a p-channel MOSFET 18, a first n-channel MOSFET 20, a second n-channel MOSFET 22, a third npn transistor 24, a first resistance 26, a second resistance 27, a third resistance 28, an $n\phi$ network 30, a first diode 32, a second diode 33 and a third diode 34. The $n\phi$ network 30 includes a fourth npn transistor 36, a fourth resistance 38 and a fifth resistance 40, with the fourth resistance 38 being coupled between the base and the emitter of the fourth third npn transistor 36, and with the fifth resistance 40 being connected between the collector and the base of the fourth npn transistor 36.

The first inverter 10 and the second inverter 12 are each coupled between a voltage supply terminal 42 and a circuit ground terminal 43, and have a common inverter input terminal 44.

The first npn transistor 14 is coupled between the voltage supply terminal 42 and a TTL interface terminal 46 by the resistance 27 and the diode 33 respectively; and the second npn transistor 16 is connected in series with the first npn transistor 14 between the TTL interface terminal 46 and the ground terminal 43.

The first npn transistor 14 has its base coupled to the output terminal 48 of the second inverter 12 for enabling the first npn transistor 14 to conduct current between the voltage supply terminal 42 and the TTL interface terminal 46 when a low input signal is applied at the inverter input terminal 44, and for clamping the first npn transistor 14 in a non-conductive state when a high input signal is applied at the inverter input terminal 44.

The second npn transistor 16 has its base 50 coupled to the ground terminal 43 through the second n-channel MOSFET 22 that has its gate coupled to the output terminal 49 of the first inverter 10 for clamping the second npn transistor 16 in a nonconductive state when a low input signal is applied at the inverter input terminal 44.

The second npn transistor 16 also has its base coupled to the voltage supply terminal 42 via the third npn transistor 24, which in turn has its base connected to the voltage supply terminal 42 by the first resistance 26 and the p-channel MOSFET 18. The p-channel MOSFET 18 has its gate connected to the inverter input terminal 44 so that the third npn transistor 24 is rendered conductive for enabling the second npn transistor 16 to conduct current from the TTL interface terminal 46 to the ground terminal 43 when a high input signal is applied at the inverter input terminal 44. The base of the third npn transistor 24 is biased above circuit ground by the third resistance 28. The second n-channel MOSFET is connected between the base of the third npn transistor 24 and the ground terminal 43, and has its gate connected to the output of the first inverter 10 for clamping the base of the third npn transistor 14 to circuit ground when a high input signal is applied at the inverter input terminal 44.

The fourth npn transistor 36 of the $n\phi$ network 30 has its emitter coupled to the TTL output terminal 46 by the third diode 34 and its collector 51 coupled to the base of the third npn transistor 24 for limiting the base current of the second npn transistor 16 in order to prevent saturation of the second npn transistor 16.

In an operating $n\phi$ network, such as network 30, because the base current is negligible, $V_c = V_e + n\phi$, wherein $\phi = V_b - V_e$; $V_b$, $V_c$ and $V_e$ are the base voltage, the collector voltage and the emitter voltage of the transistor 36; $n = (1 + R_2/R_1)$; $R_1$ is the resistance 40 connected between the base and emitter of the transistor 36; and $R_2$ is the resistance 38 connected between the base and the collector of the transistor 36. Because $V_c$ of the network transistor 36 is always $n\phi$ greater than $V_e$, by coupling the emitter of the network transistor 36 to the collector of the second npn transistor 16 and the collector of the network transistor 36 to the base of the second npn transistor 16, and by choosing the values of the resistances $R_1$ and $R_2$ such that $n = 1.5$, when $V_c$ of the network transistor 36 is maintained at $3\phi$ (approximately 2.1 volts), the collector-to-base voltage of the second npn transistor 16 is maintained at $0.5\phi$ (approximately 0.35 volts) and thereby prevents saturation of the second npn transistor 16, which would occur if the base-to-collector voltage of the second npn transistor 16 reached or exceeded 0.4 volts.

SUMMARY OF THE INVENTION

The present invention provides a TTL interface circuit that includes an inverter coupled between a voltage supply terminal and a ground terminal, and having an input terminal and an output terminal; a first npn transistor coupled between the voltage supply terminal and a TTL interface terminal and a second npn transistor connected in series with the first npn transistor between the TTL interface terminal and the ground terminal; wherein the first npn transistor has a base coupled to the inverter output terminal for enabling the first npn transistor to conduct current between the voltage supply terminal and the TTL interface terminal when a low input signal is applied at the inverter input terminal, and for clamping the first npn transistor in a non-conductive state when a high input signal is applied at the inverter input terminal; and wherein the second npn transistor has a base coupled to the ground terminal through a first switching means that is coupled to the inverter for clamping the second npn transistor in a nonconductive state when a low input signal is applied at the inverter input terminal; and limiting means coupled between the TTL output terminal and the base of the second npn transistor for limiting the base current of the second npn transistor in order to prevent saturation of the second npn transistor; wherein circuit means are coupled between the TTL output terminal and the base of the second npn transistor by a second switching means that is coupled to the inverter for enabling current to be conducted to the base of the second npn transistor through said circuit means from a load connected to the TTL output terminal when a high input signal is applied at the inverter input terminal, for enabling the second npn transistor to conduct current from the TTL interface terminal to the ground terminal.

The TTL interface circuit of the present invention requires less power than prior art TTL interface circuits because the current provided to the base of the second npn transistor to render the second npn transistor conductive is supplied from the load connected to the TTL output terminal rather than from the voltage supply terminal of the interface circuit. The transition of speed of the TTL output terminal from a high state to a low state is also faster because of there being less loading on the voltage supply of the interface circuit.

In one aspect of the present invention, the limiting means and the circuit means include a singular $n\phi$ network coupled in series with the second switching means between the TTL output terminal and the base of the second npn transistor for both limiting the base current of the second npn transistor in order to prevent saturation of the second npn transistor, and conducting current to the base of the second npn transistor from said load connected to the TTL output terminal when a high input signal is applied at the inverter input terminal.

In order to provide for instances when there is no load connected to the TTL output terminal, the TTL interface circuit of the present invention preferably further includes a switchable current source coupled between the voltage supply terminal and the $n\phi$ network, and coupled to the inverter for providing a minimum base current to the second npn transistor if there is no load connected to the TTL output terminal when a high input signal is applied at the inverter input terminal.

Additional features of the present invention are described in relation to the description of the preferred embodiment.

DESCRIPTION OF THE PREFERRED EMBODIMENT

Figure 2:
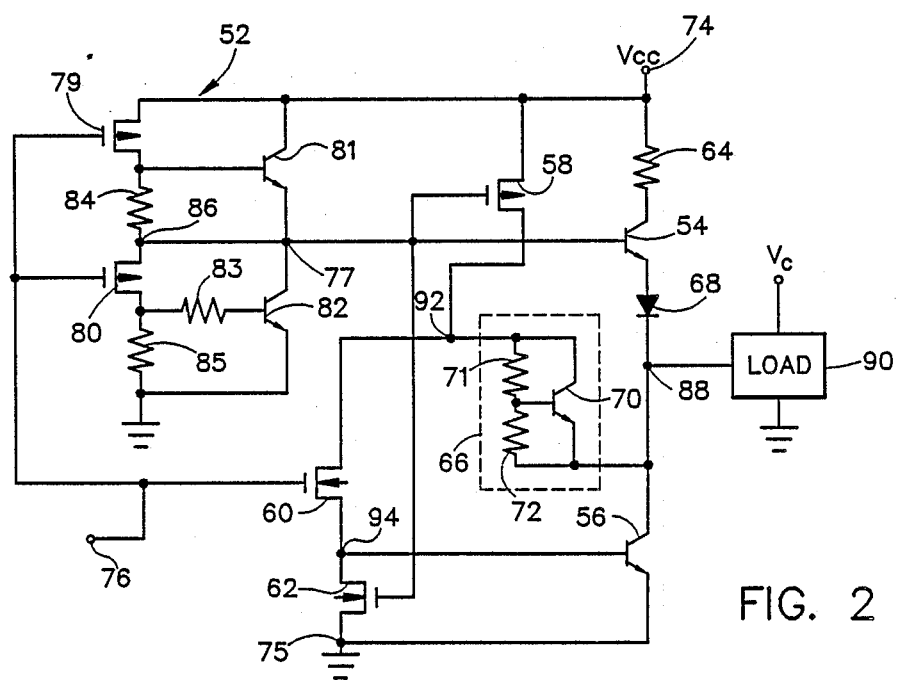
FIG. 2 is a schematic circuit diagram of a preferred embodiment of a TTL-level-output interface circuit according to the present invention.

Referring to FIG. 2, a preferred embodiment of the TTL-level-output interface circuit of the present invention includes a biCMOS inverter 52, a first npn transistor 54, a second npn transistor 56, a p-channel MOSFET 58, a first n-channel MOSFET 60, a second n-channel MOSFET 62, a resistance 64, an $n\phi$ network 66, and a diode 68. The $n\phi$ network 66 includes a third npn transistor 70, a second resistance 71 and a third resistance 72, with the second resistance 71 being coupled between the base and the emitter of the third npn transistor 70, and with the third resistance 72 being connected between the collector and the base of the third npn transistor 70.

The biCMOS inverter 52 is coupled between a voltage supply terminal 74 and a circuit ground terminal 75, and has an inverter input terminal 76 and an inverter output terminal 77. The biCMOS inverter 52 includes a p-channel MOSFET 79, an n-channel MOSFET 80, a first npn transistor 81, a first npn transistor 82, a first resistance 83, a second resistance 84 and a third resistance 85.

The p-channel MOSFET 79 is connected in series with the n-channel MOSFET 80 by the second resistance 84. The p-channel MOSFET 79 is coupled to the voltage supply terminal 74; and the n-channel MOSFET is coupled to the ground terminal 75 by the third resistance 85. The p-channel MOSFET 79 and the n-channel MOSFET 80 each have their gate coupled to the inverter input terminal 76 and are coupled to each other at a CMOS output terminal 86. The CMOS output terminal 86 is connected to the inverter output terminal 77 by the first resistance 83.

Figure 1:
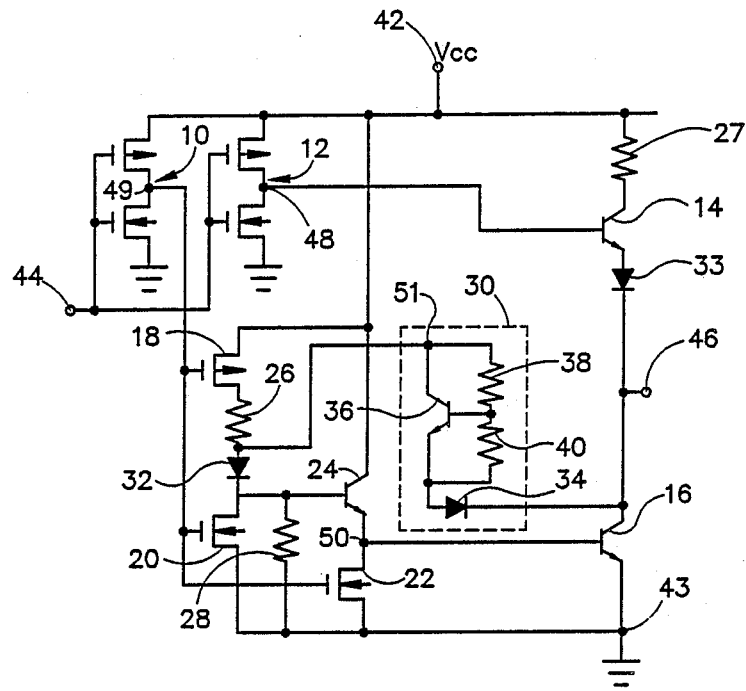
FIG. 1 is a schematic circuit diagram of a prior art TTL-level-output interface circuit.

In an alternative preferred embodiment, a CMOS inverter, such as the inverter 10 in the prior art device of FIG. 1, is substituted for the biCMOS inverter 52.

The first npn transistor 54 is coupled between the voltage supply terminal 74 and a TTL interface terminal 88 by the resistance 64 and the diode 68 respectively; and the second npn transistor 56 is connected in series with the first npn transistor 54 between the TTL interface terminal 88 and the ground terminal 75.

The first npn transistor 54 has its base coupled to the inverter output terminal 77 for enabling the first npn transistor 54 to conduct current between the voltage supply terminal 75 and the TTL interface terminal 88 when a low input signal is applied at the inverter input terminal 76, and for clamping the first npn transistor 54 in a non-conductive state when a high input signal is applied at the inverter input terminal 76.

The second npn transistor 56 has its base 94 coupled to the ground terminal 75 through the second n-channel MOSFET 62, which has its gate coupled to the inverter output terminal 77 for clamping the second npn transistor 56 in a nonconductive state when a low input signal is applied at the inverter input terminal 76.

The nφ network 66 is coupled between the TTL output terminal 88 and the base of the second npn transistor 56 by the first n-channel MOSFET 60, which has its gate connected to the inverter input terminal 76. When a high input signal is applied to the inverter input terminal 76, the the first n-channel MOSFET 60 couples the nφ network 66 to the base of the second npn transistor 56, in order both to limit the base current of the second npn transistor 56 in order to prevent saturation of the second npn transistor 56, and to enable current to be conducted to the base of the second npn transistor 56 through the nφ network 66 from a load 90 connected to the TTL output terminal 88, for enabling the second npn transistor 56 to conduct current from the TTL interface terminal 88 to the ground terminal 75.

The p-channel MOSFET 58 is coupled between the voltage supply terminal 74 and the junction 92 of the nφ network 66 with the first n-channel MOSFET 60. The p-channel MOSFET 58 has its gate connected to the inverter output terminal 77 and functions as a switchable current source for providing a minimum base current to the second npn transistor 56 if there is no load connected to the TTL output terminal 88 when a high input signal is applied at the inverter input terminal 76.

Figure 3A:
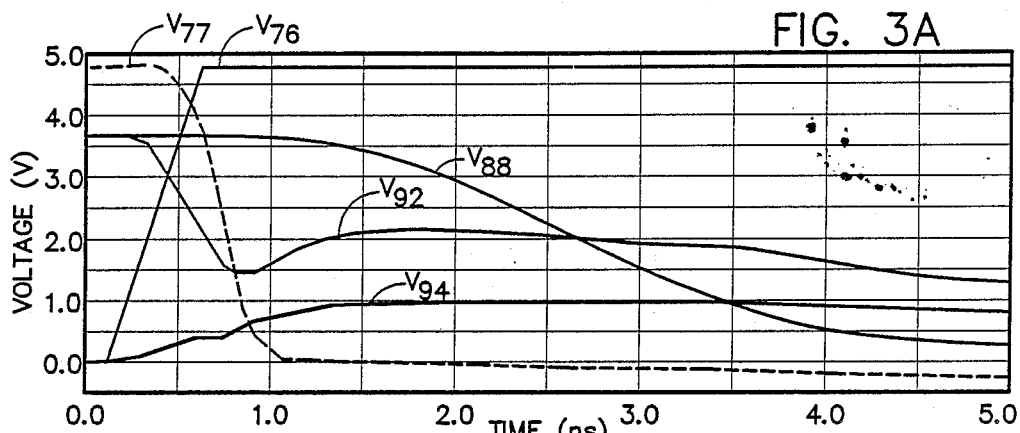
FIG. 3A is a waveform showing voltage transition at the TTL output terminal of the interface circuit of the present invention in response to a high input signal being provided at the inverter input terminal.
Figure 3B:
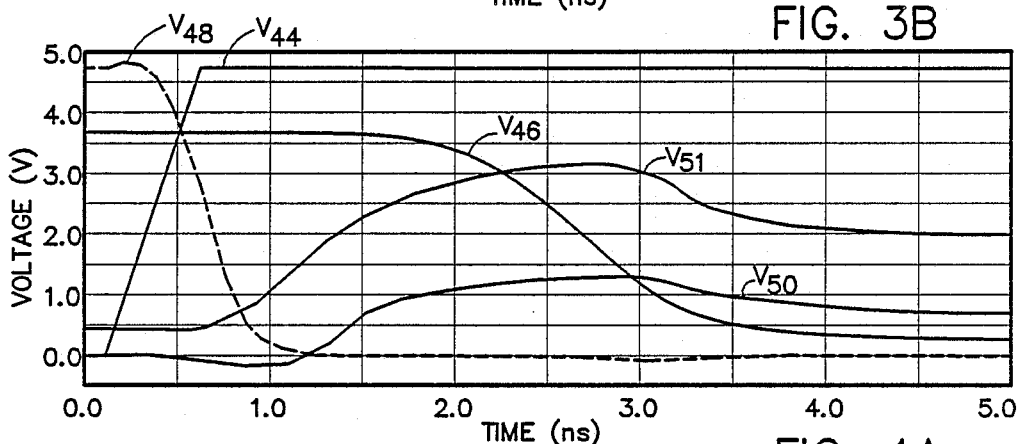
FIG. 3B is a waveform showing voltage transition at the TTL output terminal of the prior art interface circuit of FIG. 1 in response to a high input signal being provided at the inverter input terminal.
Figure 4A:
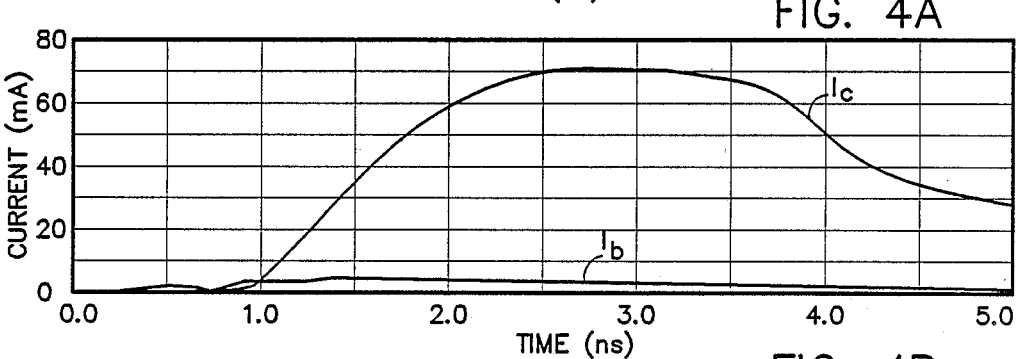
FIG. 4A is a waveform showing current transition at the TTL output terminal of the interface circuit of the present invention in response to a high input signal being provided at the inverter input terminal.
Figure 4B:
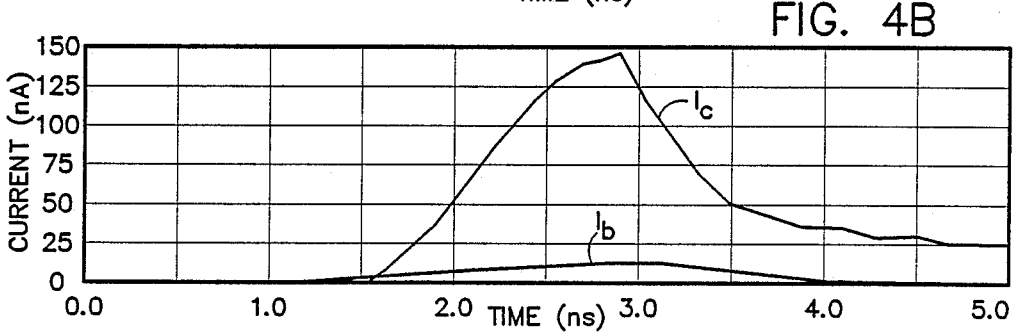
FIG. 4B is a waveform showing current transition at the TTL output terminal of the prior art interface circuit of FIG. 1 in response to a high input signal being provided at the inverter input terminal.
Figure 5A:
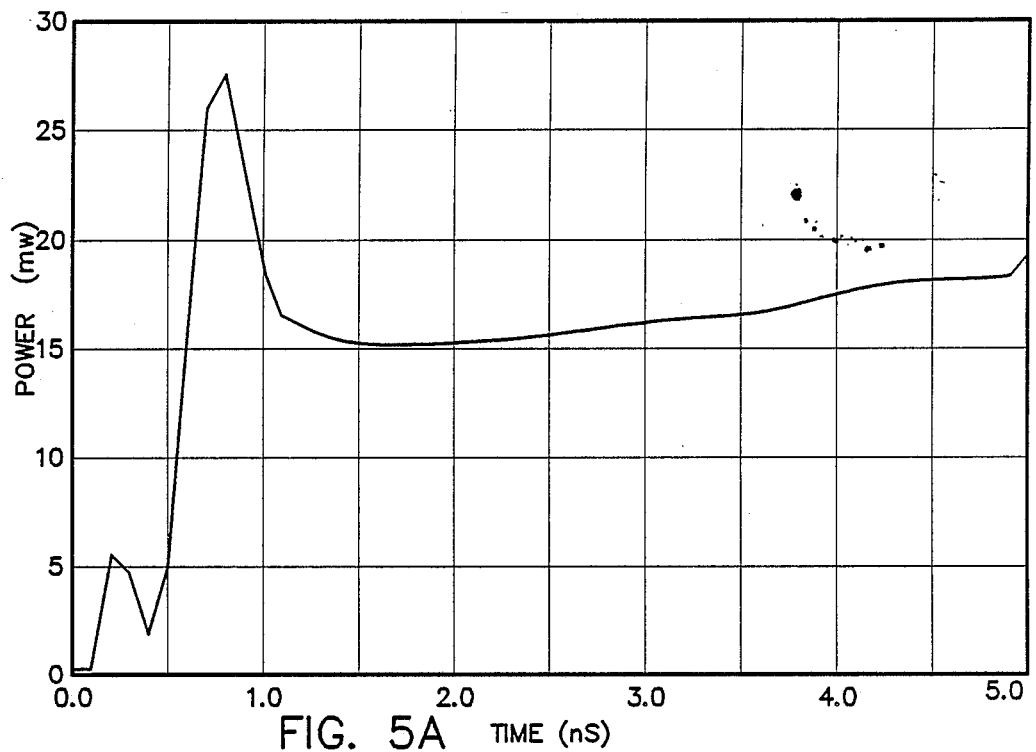
FIG. 5A is a waveform showing power transition at the TTL output terminal of the interface circuit of the present invention in response to a high input signal being provided at the inverter input terminal.
Figure 5B:
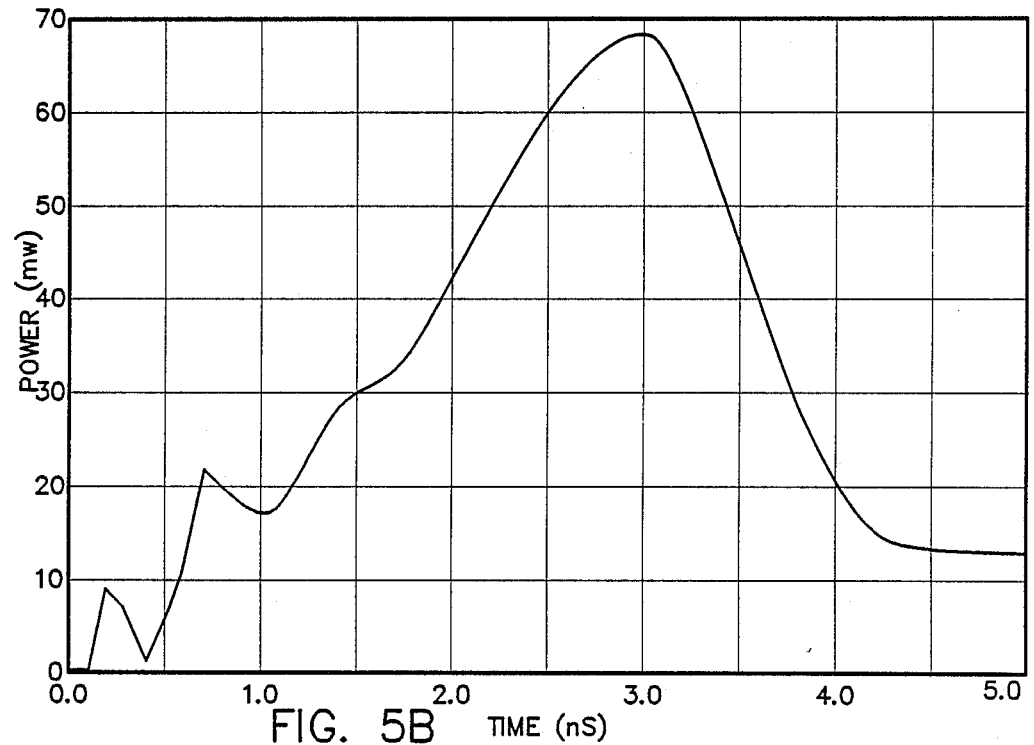
FIG. 5B is a waveform showing power transition at the TTL output terminal of the prior art interface circuit of FIG. 1 in response to a high input signal being provided at the inverter input terminal.

The improved performance of the TTL-level-output interface circuit of the present invention in response to a high level input signal being applied to the inverter input terminal 76 is illustrated in FIGS. 3A, 4A and 5A in contrast to the performance of the prior art TTL-level-output interface circuit of FIG. 1, which is illustrated in FIGS. 3B, 4B and 5B.

Referring to FIGS. 3A and 3B, it is seen that the voltage transitions for the circuit of the present invention commences earlier and are less sharp than the voltage transitions for the prior art circuit.

Referring to FIGS. 4A and 4B, it is seen that the current transition $I_c$ for the circuit of the present invention is not only less sharp than the current transition $I_c$ for the prior art circuit, but also peaks at only approximately one-half the magnitude.

Referring to FIGS. 5A and 5B, it is seen that the power transition for the circuit of the present invention is not only less sharp than the power transition for the prior art circuit, but also peaks at only approximately one-half the magnitude. The average power during the transition in the circuit of the present invention is approximately 15.5 milliwatts, and the average power during the transition in the prior art circuit is approximately 31 milliwatts.

These measurements were made with a voltage of 4.75 volts applied to the voltage supply terminals 42, 74. A standard TTL load with a rated current of $I_{OL}$ of 24 ma and a rated voltage $V_{OL}$ of less than 0.4 volts was connected to the TTL terminal 46, 88 of the respective circuits. The TTL terminal was also coupled to a 4.75 volt supply through a 155 ohm resistance. The operating temperature was 125° C. The values of the resistances in the circuit of the present invention (FIG. 2) and the prior art circuit (FIG. 1) are set forth in Tables 2 and 1 respectively.

TABLE 1

| Resistance Values in Circuit of FIG. 1 | |
| --- | --- |
| Resistance | Ohms |
| 26 | 100 |
| 27 | 50 |
| 28 | 5,000 |
| 38 | 750 |
| 40 | 1,500 |

TABLE 2

| Resistance Values in Circuit of FIG. 2 | |
| --- | --- |
| Resistance | Ohms |
| 64 | 50 |
| 71 | 750 |
| 72 | 1,500 |
| 83 | 5,000 |
| 84 | 50 |
| 85 | 5,000 |

In view of the smoother transition characteristics of the interface circuit of the present invention, as illustrated in FIGS. 3A, 4A and 5A as compared above with the transition characteristics of the prior art circuit illustrated in FIGS. 3B, 4B and 5B, less noise is injected into the power supply for the interface circuit.

In addition, the interface circuit of the present invention requires less area than the prior art interface circuit.

I claim:

1. A TTL interface circuit, comprising
   an inverter coupled between a voltage supply terminal and a ground terminal, and having an input terminal and an output terminal;
   a first npn transistor coupled between the voltage supply terminal and a TTL interface terminal and a second npn transistor connected in series with the first npn transistor between the TTL interface terminal and the ground terminal;
   wherein the first npn transistor has a base coupled to the inverter output terminal for enabling the first npn transistor to conduct current between the voltage supply terminal and the TTL interface terminal when a low input signal is applied at the inverter input terminal, and for clamping the first npn transistor in a non-conductive state when a high input signal is applied at the inverter input terminal;
   wherein the second npn transistor has a base coupled to the ground terminal through a first switching means that is coupled to the inverter for clamping the second npn transistor in a nonconductive state when a low input signal is applied at the inverter input terminal; and
   limiting means coupled between the TTL output terminal and the base of the second npn transistor for limiting the base current of the second npn transistor in order to prevent saturation of the second npn transistor;
   wherein circuit means are coupled between the TTL output terminal and the base of the second npn transistor by a second switching means that is coupled to the inverter for enabling current to be conducted to the base of the second npn transistor through said circuit means from a load connected to the TTL output terminal when a high input signal is applied at the inverter input terminal, for enabling the second npn transistor to conduct current from the TTL interface terminal to the ground terminal.

2. A TTL interface circuit according to claim 1, wherein the limiting means and the circuit means comprise a singular n$\phi$ network coupled in series with the second switching means between the TTL output terminal and the base of the second npn transistor for both limiting the base current of the second npn transistor in order to prevent saturation of the second npn transistor, and conducting current to the base of the second npn transistor from said load connected to the TTL output terminal when a high input signal is applied at the inverter input terminal.

3. A TTL interface circuit according to claim 2, further comprising
a switchable current source coupled between the voltage supply terminal and the junction of the n$\phi$ network with the second switching means, and coupled to the inverter for providing a minimum base current to the second npn transistor if there is no load connected to the TTL output terminal when a high input signal is applied at the inverter input terminal.

4. A TTL interface circuit according to claim 2, wherein the second switching means comprises a MOSFET coupled in series between the n$\phi$ network and the base of the second npn transistor, and having a gate coupled to the inverter for connecting the n$\phi$ network to the base of the second npn transistor when a high input signal is applied to the inverter input terminal.

5. A TTL interface circuit according to claim 4, wherein the inverter is a CMOS inverter.

6. A TTL interface circuit according to claim 5, wherein the CMOS inverter is a biCMOS inverter.

7. A TTL interface circuit according to claim 5, further comprising
a MOSFET coupled between the voltage supply terminal and the junction of the n$\phi$ network with the MOSFET of the second switching means, and having a gate coupled to the inverter for providing a minimum base current to the second npn transistor if there is no load connected to the TTL output terminal when a high input signal is applied at the inverter input terminal.

8. A TTL interface circuit according to claim 4, further comprising
a MOSFET coupled between the voltage supply terminal and the junction of the n$\phi$ network with the MOSFET of the second switching means, and having a gate coupled to the inverter for providing a minimum base current to the second npn transistor if there is no load connected to the TTL output terminal when a high input signal is applied at the inverter input terminal.

9. A TTL interface circuit according to claim 1, further comprising
a switchable current source coupled between the voltage supply terminal and the junction of the circuit means with the second switching means, and coupled to the inverter for providing a minimum base current to the second npn transistor if there is no load connected to the TTL output terminal when a high input signal is applied at the inverter input terminal.

10. A TTL interface circuit according to claim 9, wherein the switchable current source comprises
a MOSFET coupled between the voltage supply terminal and the junction of the circuit means with the second switching means, and having a gate coupled to the inverter for providing a minimum base current to the second npn transistor if there is no load connected to the TTL output terminal when a high input signal is applied at the inverter input terminal.

11. A TTL interface circuit according to claim 1, wherein the second switching means comprises a MOSFET coupled in series between the circuit means and the base of the second npn transistor, and having a gate coupled to the inverter for connecting the circuit means to the base of the second npn transistor when a high input signal is applied to the inverter input terminal.

12. A TTL interface circuit according to claim 1, wherein the inverter is a CMOS inverter.

13. A TTL interface circuit according to claim 12, wherein the CMOS inverter is a biCMOS inverter.

* * * * *